United States Patent [19]

Yu et al.

[11] Patent Number: 5,858,623
[45] Date of Patent: Jan. 12, 1999

[54] METHOD FOR ATTENUATING PHOTORESIST LAYER OUTGASSING

[75] Inventors: Chen-Hua Yu; Syun-Ming Jang, both of Hsin-Chu; Tsung-Hou Li, Taipei, all of Taiwan

[73] Assignee: Taiwan Semiconductor Manufacturing Company, Hsin-Chu, Taiwan

[21] Appl. No.: 826,712

[22] Filed: Apr. 7, 1997

[51] Int. Cl.$^6$ ........................................ G03F 7/00
[52] U.S. Cl. ...................... 430/315; 430/327; 430/494; 250/492.21; 427/525; 427/526; 438/373
[58] Field of Search ..................... 430/311, 315, 430/313, 327, 494; 250/492.2, 492.21, 492.3; 427/523, 525, 526; 438/373, 480, 514, 766

[56] References Cited

U.S. PATENT DOCUMENTS 4,851,691  7/1989  Hanley ................................ 250/492.2

*Primary Examiner*—Kathleen Duda
*Attorney, Agent, or Firm*—George O. Saile; Stephen B. Ackerman; Alek P. Szecsy

[57] ABSTRACT

A method for forming a patterned photoresist layer. There is first provided a substrate. There is then formed over the substrate a blanket photoresist layer. The blanket photoresist layer is then implanted with a first ion beam to form an ion implanted blanket photoresist layer. The first ion beam employs a first ion having a first energy and a first dose sufficient such that an ion implanted patterned photoresist layer formed from the ion implanted blanket photoresist layer will not substantially outgas when the ion implanted patterned photoresist layer is exposed to a second beam. The ion implanted blanket photoresist layer is then patterned to form the ion implanted patterned photoresist layer. The method may be employed in selective high energy beam processing of the substrate. The method is particularly suited to selective high energy ion implant processing of semiconductor substrates employed within integrated circuit microelectronics fabrications.

16 Claims, 1 Drawing Sheet

METHOD FOR ATTENUATING PHOTORESIST LAYER OUTGASSING

BACKGROUND OF THE INVENTION

1. Field of the Invention

The present invention relates generally to photoresist layers employed within microelectronics fabrications. More particularly, the present invention relates to methods for attenuating outgassing of photoresist layers employed within microelectronics fabrications.

2. Description of the Related Art

Known in the art of microelectronics fabrication, such as but not limited to integrated circuit microelectronics fabrication, is the use of patterned photoresist layers as masking layers within photolithographic methods employed to define patterned layers and patterned structures within microelectronics fabrications. Similarly, it is also known in the art of microelectronics fabrication that patterned photoresist layers when employed as masking layers with respect to microelectronic fabrication processes which employ high energy beams employed within low pressure reactors, such as but not limited to high energy ion implantation beams employed within low pressure ion implantation reactors, often exhibit significant outgassing which compromises the low pressure reactor operating pressure desired or required for the microelectronic fabrication process which employs the high energy beam. Often the low pressure reactor operating pressure is sufficiently compromised such that there is simultaneously also compromised other desired operating parameters of the microelectronic fabrication process which employs the high energy beam thus simultaneously precluding formation of an operable or optimal microelectronics fabrication.

Therefore, it is towards the goal of providing for use within microelectronics fabrication a method for attenuating patterned photoresist layer outgassing when a patterned photoresist layer is exposed to a high energy beam within a low pressure reactor that the present invention is generally directed.

Various aspects of interactions of photoresist layers with high energy beams employed within microelectronics fabrications, such as but not limited to integrated circuit microelectronics fabrications, have been disclosed in the art.

For example, Daniel in U.S. Pat. No. 5,037,767 discloses a method for manufacturing a semiconductor device wherein there is implanted through a blanket ion beam sensitive photoresist layer a dopant ion into a semiconductor substrate upon which is formed the blanket ion beam sensitive photoresist layer. There is thus formed within the semiconductor substrate doped regions, along with an ion beam exposed portion of the blanket ion beam sensitive photoresist layer and an ion beam unexposed portion of the blanket ion beam sensitive photoresist layer. The ion beam unexposed portion of the blanket ion beam sensitive photoresist layer is then developed to leave remaining upon the semiconductor substrate a self aligned mask formed from the ion beam exposed portions of the blanket ion beam sensitive photoresist layer, where the self aligned mask is employed within further integrated circuit processing when forming a semiconductor device within the semiconductor substrate.

In addition, and more pertinent to the present invention, Hanley in U.S. Pat. No. 4,851,691 discloses a pretreating method for attenuating outgassing of a patterned photoresist layer formed upon a substrate prior to processing the substrate within a high energy ion beam. Through the method, the patterned photoresist layer is first bombarded with ions which are electrically inactive with respect to the substrate prior to processing the substrate within the high energy ion beam comprised of ions which are electrically active with respect to the substrate.

Desirable in the art are additional methods through which patterned photoresist layer outgassing incident to exposing patterned photoresist layers to high energy beams within low pressure reactors may be attenuated. More particularly desirable in the art are additional methods through which patterned photoresist layer outgassing incident to exposing patterned photoresist mask layers to high energy ion implantation beams within low pressure ion implantation reactors may be attenuated. It is towards the foregoing goals that the present invention is more specifically directed.

SUMMARY OF THE INVENTION

A first object of the present invention is to provide a method through which patterned photoresist layer outgassing incident to exposing a patterned photoresist layer to a high energy beam within a low pressure reactor may be attenuated.

A second object of the present invention is to provide a method in accord with the first object of the present invention, where the high energy beam is a high energy ion implantation beam and the low pressure reactor is a low pressure ion implantation reactor.

A third object of the present invention is to provide a method in accord with the first object of the present invention and the second object of the present invention, which method is readily manufacturable.

In accord with the objects of the present invention, there is provided by the present invention a method through which patterned photoresist layer outgassing incident to exposing a patterned photoresist layer to a high energy beam within low pressure reactor may be attenuated. To practice the method of the present invention, there is first provided a substrate. There is then formed over the substrate a blanket photoresist layer. The blanket photoresist layer is then implanted with a first ion beam to form an ion implanted blanket photoresist layer, where the first ion beam employs a first ion having a first energy and a first dose sufficient such that an ion implanted patterned photoresist layer formed from the ion implanted blanket photoresist layer will not substantially outgas when the ion implanted patterned photoresist layer is exposed to a second beam. Finally, the ion implanted blanket photoresist layer is then patterned to form the ion implanted patterned photoresist layer.

There is provided by the present invention a method through which patterned photoresist layer outgassing incident to exposing a patterned photoresist layer to a high energy beam within a low pressure reactor may be attenuated. The method of the present invention realizes this object by first implanting a blanket photoresist layer from which is formed the patterned photoresist layer with a first ion beam to form an ion implanted blanket photoresist layer, where the first ion beam employs a first ion having a first energy and a first dose sufficient such that an ion implanted patterned photoresist layer formed from the ion implanted blanket photoresist layer will not substantially outgas when the ion implanted patterned photoresist layer is exposed to a second beam. The second beam may be a high energy beam.

The present invention may be practiced where the high energy beam is a high energy ion implantation beam and the low pressure reactor is a low pressure ion implantation reactor. The method of the present invention does not discriminate with respect to the nature of the high energy beam and the nature of the low pressure reactor. Thus, although the method of the present invention is more likely to be practiced where the high energy beam is a high energy ion implantation beam and the low pressure reactor is a low pressure ion implantation reactor, the method of the present invention may also be employed where: (1) the high energy beam is a high energy beam selected from the group of high energy beams including but not limited to high energy radiation beams, high energy particle beams and high energy ion beams including but not limited to high energy ion implantation beams, high energy ion assisted etch beams and high energy ion assisted deposition beams; and (2) the low pressure reactor is a low pressure reactor selected from the group of low pressure reactors corresponding with the foregoing group of high energy beams.

The method of the present invention is readily manufacturable. The method of the present invention provides that there is employed in modifying within a microelectronics fabrication a blanket photoresist layer from which is subsequently formed a patterned photoresist layer a first ion beam to provide an ion implanted blanket photoresist layer from which is formed an ion implanted patterned photoresist layer which exhibits attenuated outgassing when exposed to a second beam. Methods and materials through which multiple sequential beams including ion beams may be employed within microelectronics fabrications, such as but not limited to integrated circuit microelectronic fabrications are known in the art of microelectronics fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method through which patterned photoresist layer outgassing incident to exposing a patterned photoresist layer to a high energy beam within microelectronics fabrications such as but not limited to integrated circuit microelectronics fabrications may be attenuated. The method of the present invention realizes this object through implanting a blanket photoresist layer from which is formed the patterned photoresist layer with a first ion beam to form a ion implanted blanket photoresist layer. The first ion beam employs a first ion having a first energy and a first dose sufficient such that an ion implanted patterned photoresist layer formed from the ion implanted blanket photoresist layer will not substantially outgas when the ion implanted patterned photoresist layer is exposed to a second beam. The second beam may be a high energy beam. The ion implanted blanket photoresist layer is then patterned to form the ion implanted patterned photoresist layer whose outgassing incident to exposing the ion implanted patterned photoresist layer to the second beam is attenuated.

Although the preferred embodiment of the method of the present invention illustrates the method of the present invention employed within integrated circuit microelectronics fabrication in forming a patterned photoresist layer employed within an ion implantation method through which portions of a semiconductor substrate upon which is formed the patterned photoresist layer are ion implanted in selectively forming implanted semiconductor substrate regions within the semiconductor substrate, the method of the present invention may also be employed in attenuating outgassing of patterned photoresist layers formed upon substrates other than semiconductor substrates which are selectively processed employing high energy beams other than ion implantation beams and subsequently employed in microelectronics fabrications other than integrated circuit microelectronics fabrications. In that regard, the method of the present invention may be employed in attenuating outgassing of patterned photoresist layers formed upon substrates including but not limited to conductor substrates, semiconductor substrates and insulator substrates, which substrates are selectively processed employing high energy beams including but not limited to high energy radiation beams, high energy particle beams, and high energy ion beams including but not limited to high energy ion implantation beams, high energy ion assisted etch beams and high energy ion assisted deposition beams, and subsequently employed within microelectronics fabrications including but not limited to integrated circuit microelectronics fabrications, ceramic substrate packaging microelectronics fabrications, solar cell microelectronics fabrications and flat display panel microelectronics fabrications.

Figure 1:
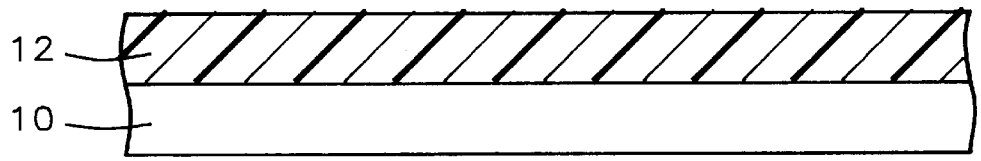
FIGS. 1 to FIG. 4 show a series of schematic cross-sectional diagrams illustrating the results of progressive stages in forming within a semiconductor substrate employed within an integrated circuit microelectronics fabrication a pair of ion implanted semiconductor substrate regions in accord with a preferred embodiment of the method of the present invention.

Referring now to FIGS. 1 to FIG. 4, there is shown a series of schematic cross-sectional diagrams illustrating the results of progressive stages in forming for use within an integrated circuit microelectronics fabrication an ion implanted semiconductor substrate formed in accord with a preferred embodiment of the present invention. Shown in FIG. 1 is a schematic cross-sectional diagram of the semiconductor substrate at an early stage in its fabrication.

Shown in FIG. 1 is a semiconductor substrate 10 having formed thereupon a blanket photoresist layer 12. Although semiconductor substrates are known in the art of integrated circuit microelectronics fabrications with either dopant polarity, various dopant concentrations and several crystallographic orientations, for the preferred embodiment of the method of the present invention, the semiconductor substrate 10 is preferably a (100) silicon semiconductor substrate having an N- or P- doping.

Similarly, it is also known in the art that photoresist layers employed within microelectronics fabrications including but not limited to integrated circuit microelectronics fabrications may be formed from photoresist materials selected from the general groups of photoresist materials including but not limited to positive photoresist materials and negative photoresist materials. Thus, for the preferred embodiment of the method of the present invention, the blanket photoresist layer 12 may be formed of either a positive photoresist material or a negative photoresist material. Preferably the blanket photoresist layer 12 so formed is formed to a thickness of from about 5000 to about 40000 angstroms upon the semiconductor substrate 10.

Figure 2:
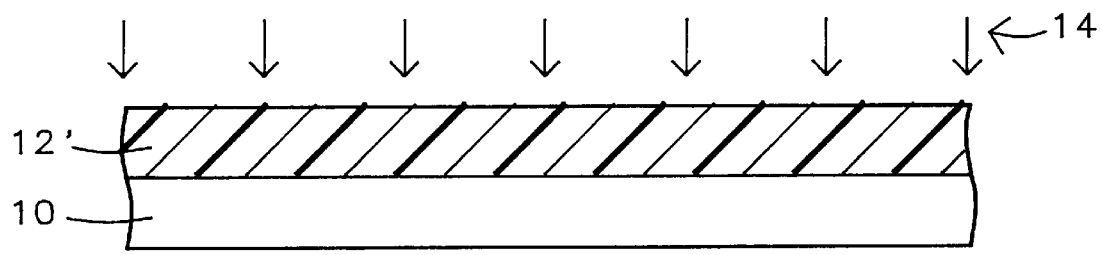

Referring now to FIG. 2, there is shown a schematic cross-sectional diagram illustrating the results of further processing of the semiconductor substrate 10 whose schematic cross-sectional diagram is illustrated in FIG. 1. Shown in FIG. 2 is a semiconductor substrate 10 otherwise equivalent to the semiconductor substrate 10 whose schematic cross-sectional diagram is illustrated in FIG. 1, but wherein the blanket photoresist layer 12 has been implanted with a first ion implant beam 14 to form an ion implanted blanket photoresist layer 12'. Within the preferred embodiment of the method of the present invention, the first ion beam 14 employs a first ion having a first energy and a first dose sufficient such that an ion implanted patterned photoresist layer formed from the ion implanted blanket photoresist layer 12' will not substantially outgas when the ion implanted patterned photoresist layer is exposed to a second ion implant beam having a second energy and a second dose.

Within the preferred embodiment of the method of the present invention and within a general embodiment of the method of the present invention there may be employed as the first ion ions which are either electrically active with respect to a substrate such as the semiconductor substrate 10 or ions which are electrically inactive with respect to a substrate such as the semiconductor substrate 10. Similarly, as is also understood by a person skilled in the art, within the preferred embodiment of the method of the present invention and within a general embodiment of the method of the present invention various technical considerations are employed in determining an appropriate first energy and an appropriate first dose for a specific first ion within the context of a specific second beam in order to optimally attenuate outgassing of an ion implanted patterned photoresist formed from an ion implanted blanket photoresist layer, such as the ion implanted blanket photoresist layer 12', later exposed to a second beam. Such technical considerations include in part: (1) the projection range of the first ion within a blanket photoresist layer, such as the blanket photoresist layer 12, when forming an ion implanted blanket photoresist layer, such as the ion implanted blanket photoresist layer 12'; in conjunction with (2) the outgassing characteristics of an ion implanted patterned photoresist layer formed from the ion implanted blanket photoresist layer incident to exposure of the ion implanted patterned photoresist layer to the second beam. Such technical considerations have been disclosed in some detail in the art where there is employed both a first ion beam and a second ion beam. See, for example, Hanley in U.S. Pat. No. 4,851,691, the teachings of which are incorporated herein fully by reference.

With respect to the preferred embodiment of the method of the present invention, there is preferably employed as a first ion at least either a boron ion or a phosphorus ion, since both boron ions and phosphorus ions provide comparatively low mass to charge ratio ions which are readily obtained through ion implantation methods which are conventional within integrated circuit microelectronics fabrication without modification of existing integrated circuit microelectronics fabrication process equipment. For the blanket photoresist layer 12 of thickness as noted above there is preferably employed within the preferred embodiment of the method of the present invention a boron and/or phosphorus ion implant dose of from about 2E14 to about 1E15 ions per square centimeter and a boron and/or phosphorus ion implantation energy of from about 50 to about 1000 keV.

Figure 3:
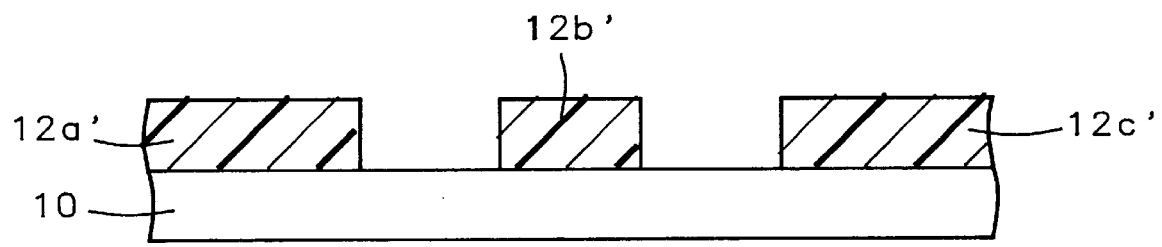

Referring now to FIG. 3, there is shown a schematic cross-sectional diagram illustrating the results of further processing of the semiconductor substrate 10 whose schematic cross-sectional diagram is illustrated in FIG. 2. Shown in FIG. 3 is a schematic cross-sectional diagram of the semiconductor substrate 10 otherwise equivalent to the semiconductor substrate 10 whose schematic cross-sectional diagram is illustrated in FIG. 2, but wherein the ion implanted blanket photoresist layer 12' has been patterned to form the ion implanted patterned photoresist layers 12a', 12b' and 12c'. Although within the general method of the present invention an ion implanted blanket photoresist layer, such as the ion implanted blanket photoresist layer 12', may be patterned to form a series of ion implanted patterned photoresist layers, such as the series of ion implanted patterned photoresist layers 12a', 12b' and 12c', through methods and materials as are conventional in the art of microelectronics fabrications, within the preferred embodiment of the method of the present invention, the ion implanted blanket photoresist layer 12' is preferably patterned to form the ion implanted patterned photoresist layers 12a', 12b' and 12c' through methods which employ minimal use of solvents or other materials which may subsequently outgas from the ion implanted patterned photoresist layers 12a', 12b' and 12c'.

Figure 4:
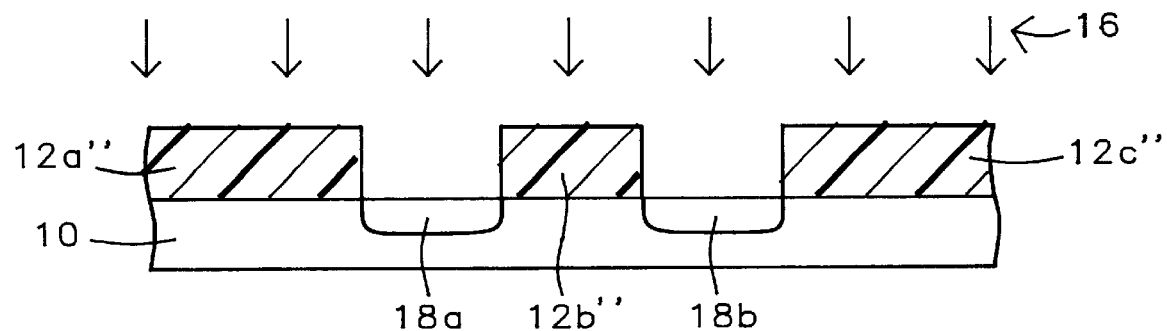

Referring now to FIG. 4, there is shown a schematic cross-sectional diagram illustrating the results of further processing of the semiconductor substrate 10 whose schematic cross-sectional diagram is illustrated in FIG. 3.

Shown in FIG. 4 is a schematic cross-sectional diagram of the semiconductor substrate 10 otherwise equivalent to the semiconductor substrate 10 whose schematic cross-sectional diagram is illustrated in FIG. 3, but wherein the portions of the semiconductor substrate 10 exposed through the ion implanted patterned photoresist layers 12a', 12b' and 12c' as illustrated in FIG. 3 are ion implanted with a second ion implant beam 16 to form within the semiconductor substrate 10 implanted semiconductor substrate regions 18a and 18b while simultaneously forming a series of twice ion implanted patterned photoresist layers 12a", 12b" and 12c". Since within the preferred embodiment of the method of the present invention the first ion beam employs a first ion having a first dose and a first energy sufficient such that the ion implanted patterned photoresist layers 12a', 12b' and 12c' formed from the ion implanted blanket photoresist layer 12' will not substantially outgas when the ion implanted patterned photoresist layers 12a', 12b' and 12c' are exposed to a second ion beam, the twice ion implanted patterned photoresist layers 12a", 12b" and 12c" so formed within the preferred embodiment of the method of the present invention have attenuated outgassing when exposed to the second ion implant beam 16 employed in forming the implanted semiconductor substrate regions 18a and 18b within the semiconductor substrate 10 while simultaneously forming the twice ion implanted patterned photoresist layers 12a", 12b" and 12c".

For the preferred embodiment of the method of the present invention, the second ion employed within the second ion implant beam 16 is preferably an arsenic ion, a boron ion or a phosphorus ion, as is most common in the art of integrated circuit microelectronics fabrication, although other ions may alternatively be employed as the second ion in order to provide unique characteristics, such as but not limited to unique scattering characteristics, to the implanted semiconductor substrate regions 18a and 18b. Preferably, the second ion of arsenic ion, boron ion or phosphorus ion is employed at an ion implantation dose of from about 1.0E12 to about 1.0E16 ions per square centimeter and an ion implantation energy of from about 50 to about 3000 keV.

With respect to the preferred embodiment of the method of the present invention and a with respect to a general embodiment of the method of the present invention, insubstantial outgassing of an ion implanted patterned photoresist layer, such as the ion implanted patterned photoresist layers 12a', 12b' and 12c', is intended to mean a level of outgassing of an ion implanted patterned photoresist layer which does not compromise operation of a microelectronics fabrication process employing the second beam.

Similarly, as is also understood by a person skilled in the art, the high energy beams, such as the high energy ion beams as referenced within this disclosure, are intended to include beams of a sufficiently high energy such that patterned photoresist layer outgassing is conventionally observed from patterned photoresist layers in the presence of these beams absent the method of the present invention.

Finally, as is also understood by a person skilled in the art, the preferred embodiment of the method of the present invention is illustrative of the method of the present invention rather than limiting of the method of the present invention. Revisions and modifications may be made to materials, structures and dimensions through which is practiced the preferred embodiment of the method of the present invention while still providing embodiments which are within the spirit and scope of the method of the present invention, as defined by the accompanying claims.

What is claimed is:

1. A method for forming a patterned photoresist layer comprising:

providing a substrate;

forming over the substrate a blanket photoresist layer;

implanting the blanket photoresist layer with a first ion beam to form an ion implanted blanket photoresist layer, the first ion beam employing a first ion having a first energy and a first dose sufficient such that an ion implanted patterned photoresist layer formed from the ion implanted blanket photoresist layer will not substantially outgas when the ion implanted patterned photoresist layer is exposed to a second beam;

patterning then the ion implanted blanket photoresist layer to form the ion implanted patterned photoresist layer; and exposing the ion implanted patterned photoresist layer to the second beam.

2. The method of claim 1 wherein the substrate is chosen from the group of substrates consisting of conductor substrates, semiconductor substrates and insulator substrates.

3. The method of claim 1 wherein the substrate is employed within a microelectronics fabrication selected from the group of microelectronics fabrications consisting of integrated circuit microelectronics fabrications, ceramic substrate packaging microelectronics fabrications, solar cell microelectronics fabrications and flat panel display microelectronics fabrications.

4. The method of claim 1 wherein the first ion is electrically active with respect to the substrate.

5. The method of claim 1 wherein the second beam is a high energy beam selected from the group of high energy beams consisting of high energy radiation beams, high energy particle beams, and high energy ion beams consisting of high energy ion implantation beams, high energy ion assisted etch beams and high energy ion assisted deposition beams.

6. The method of claim 1 wherein the first ion is electrically inactive with respect to the substrate.

7. A ion beam method for selectively processing a substrate comprising:

providing a substrate;

forming over the substrate a blanket photoresist layer;

implanting the blanket photoresist layer with a first ion beam to form an ion implanted blanket photoresist layer, the first ion beam employing a first ion having a first energy and a first dose sufficient such that an ion implanted patterned photoresist layer formed from the ion implanted blanket photoresist layer will not substantially outgas when the ion implanted patterned photoresist layer is exposed to a second ion beam;

patterning then the ion implanted blanket photoresist layer to form the ion implanted patterned photoresist layer and simultaneously expose a first portion of the substrate; and processing selectively then the first portion of the substrate employing the second ion beam.

8. The method of claim 7 wherein the substrate is chosen from the group of substrates consisting of conductor substrates, semiconductor substrates and insulator substrates.

9. The method of claim 7 wherein the substrate is employed within a microelectronics fabrication selected from the group of microelectronics fabrications consisting of integrated circuit microelectronics fabrications, ceramic substrate packaging microelectronics fabrications, solar cell microelectronics fabrications and flat panel display microelectronics fabrications.

10. The method of claim 7 wherein the first ion is electrically active with respect to the substrate.

11. The method of claim 7 wherein the second ion beam is a high energy ion beam selected from the group of high energy ion beams consisting of high energy ion implantation beams, high energy ion assisted etch beams and high energy ion assisted deposition beams.

12. The method of claim 7 wherein the first ion is electrically inactive with respect to the substrate.

13. A method for selectively ion implanting a semiconductor substrate comprising:

providing a semiconductor substrate;

forming over the semiconductor substrate a blanket photoresist layer;

implanting the blanket photoresist layer with a first ion beam to form an ion implanted blanket photoresist layer, the first ion beam employing a first ion having a first energy and a first dose sufficient such that an ion implanted patterned photoresist layer formed from the ion implanted blanket photoresist layer will not substantially outgas when the ion implanted patterned photoresist layer is exposed to a second ion beam employing a second ion having a second energy and a second dose;

patterning then the ion implanted blanket photoresist layer to form the ion implanted patterned photoresist layer and simultaneously expose a first portion of the semiconductor substrate; and implanting selectively the first portion of the semiconductor substrate with the second ion while employing the second ion beam.

14. The method of claim 13 wherein the thickness of the blanket photoresist layer is from about 5000 to about 40000 angstroms.

15. The method of claim 14 wherein:

the first ion is selected from the group of ions consisting of boron ions and phosphorus ions;

the first energy is from about 50 to about 1000 keV; and the first dose is from about $2 \times 10^{14}$ to about $1 \times 10^{15}$ ions per square centimeter.

16. The method of claim 15 wherein:

the second ion is selected from the group of ions consisting of arsenic ions, boron ions and phosphorus ions;

the second energy is from about 50 to about 3000 keV; and the second dose is from about $1 \times 10^{12}$ to about $1 \times 10^{16}$ ions per square centimeter.

* * * * *